United States Patent [19]

Minaee

[11] Patent Number: 4,718,974
[45] Date of Patent: Jan. 12, 1988

[54] PHOTORESIST STRIPPING APPARATUS USING MICROWAVE PUMPED ULTRAVIOLET LAMP

[75] Inventor: Behrooz Minaee, Campbell, Calif.

[73] Assignee: Ultraphase Equipment, Inc., San Jose, Calif.

[21] Appl. No.: 1,645

[22] Filed: Jan. 9, 1987

[51] Int. Cl.⁴ ............... B44C 1/22; C03C 15/00; C03C 25/06; B29C 37/00
[52] U.S. Cl. ................. 156/643; 156/635; 156/646; 156/655; 156/668; 156/345; 134/1; 427/54.1
[58] Field of Search ........... 156/635, 643, 646, 655, 156/662, 668, 345; 204/192.36, 298; 427/54.1; 430/329; 134/1; 118/728, 50.1, 620

[56] References Cited

U.S. PATENT DOCUMENTS

| | | | |
|---|---|---|---|
| 4,414,059 | 11/1983 | Blum et al. | 156/659.1 |
| 4,417,948 | 11/1983 | Mayne-Banton et al. | 156/643 |
| 4,512,868 | 4/1985 | Fijimura et al. | 204/298 |
| 4,673,456 | 6/1987 | Spencer et al. | 156/345 |

*Primary Examiner*—William A. Powell

*Attorney, Agent, or Firm*—Flehr, Hohback, Test, Albritton & Herbert

[57] ABSTRACT

Apparatus and method for removing organic polymers, such as photoresist, from the surface of an object, such as a semiconductor wafer. The apparatus comprises a microwave energy source and a reaction chamber housing an ultraviolet lamp and a platform for holding a semiconductor wafer. A portion of the chamber's exterior, between the ultraviolet lamp and the microwave energy source, is permeable to microwaves. The reaction chamber has an inlet and an outlet for passing a reaction gas through the reaction chamber. The platform is situated so that the full surface of a semiconductor wafer thereon is exposed to light emitted by the ultraviolet lamp which responds to microwave stimulation from the microwave energy source by emitting ultraviolet radiation having a preselected wavelength between 100 and 300 angstroms. Photoresist can be stripped from a semiconductor wafer on the platform by energizing the ultraviolet lamp while passing a reaction gas through the reaction chamber and thereby ablating organic polymers and impurities from the surface of the semiconductor wafer.

13 Claims, 4 Drawing Figures

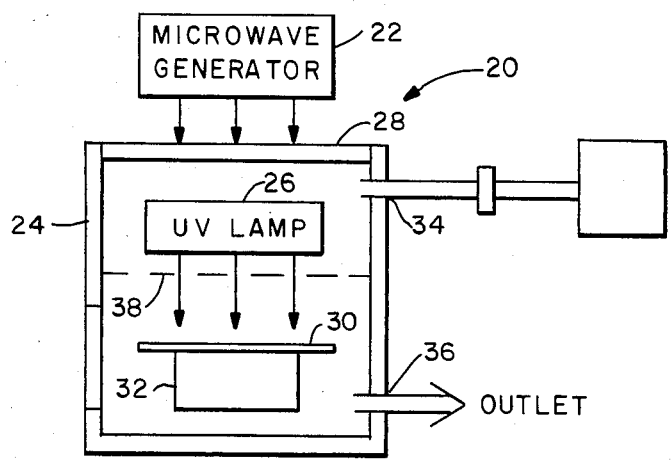
FIG.—1
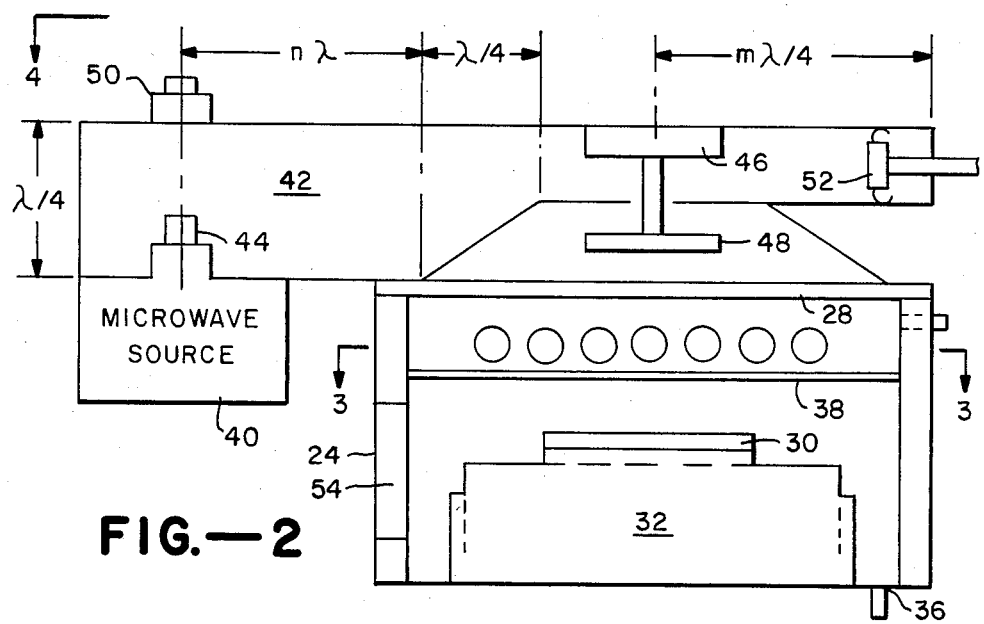
FIG.—2
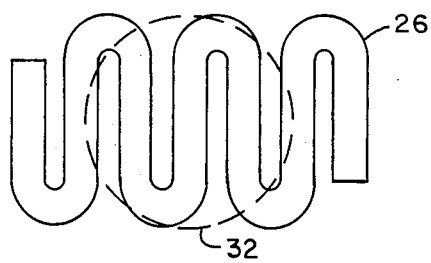
FIG.—3
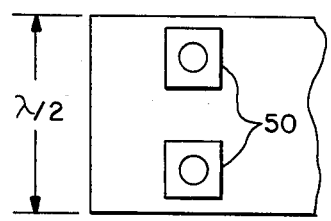
FIG.—4

PHOTORESIST STRIPPING APPARATUS USING MICROWAVE PUMPED ULTRAVIOLET LAMP

The present invention relates generally to semiconductor circuit manufacturing, and particularly to a photoablation system and method for removing photoresist and surface contaminants from a semiconductor surface using ultraviolet light.

BACKGROUND OF THE INVENTION

Photoresists are generally photosensitive organic polymers used in semiconductor manufacturing processes to encapsulate portions of a semiconductor which are to be protected from any particular processing step. The following is a brief review of the primary photoresist removal methods.

In virtually all commercially practical prior art processes, the removal of photoresist has required the use of toxic chemicals. Inorganic solutions for removing photoresist typically comprise solutions of sulfuric acid and other components such as nitric acid or peroxide. Organic solvents used for photoresist removal include aceton, trichloroethylene (TCE), methyl ethyl ketene (MEK), and isopropyl alcohol.

Another method that has been tried more recently is plasma stripping in which oxygen is electronically activated and reacted with the photoresist. Unfortunately, plasma stripping has been found to cause RF radiation damage to the semiconductor substrate and also to be prohibitively expensive because it needs to be performed in a vacuum.

It has recently been discovered that irradiation of organic polymers by short pulses of far-UV laser (e.g. 193 nm) light causes ablative photodecomposition of the material. One potential use of this discovery is the etching of photoresists. However, the use of such lasers for photoresist removal is not currently commerically feasible because such laser systems are expensive and product throughput is too slow (because the light emitted by the laser is concentrated on a very small area).

The present invention is an improvement on laser photoablation of organic polymers. In particular, the present invention uses a microwave energy source to induce the generation of high intensity, but noncoherent, far-UV light. The noncoherent UV light has been found to effectively ablate photoresist. The UV radiation is further used to heat oxygen which is blown at atmospheric pressure over the surface of the photoresist being removed. The oxygen reacts with the carries off the photoresist.

By using a microwave energized UV lamp instead of a laser, the cost of irradiating photoresist with UV light is substantially reduced. Ablation is also much faster than in the laser system because a full wafer can be exposed to the UV light from the system's lamp.

The present invention is also substantially better than a system using an electrically energized UV lamp because the microwave energized lamp is more energy efficient and avoids electrode degeneration—which limits the lift of electrically energized lamps.

It is therefore a primary object of the present invention to provide a photoablation system for removing photoresists using a microwave energized UV light source.

A second problem addressed by the present invention is the buildup of very thin layers of hydrocarbons and/or water on semiconductor wafers between processing steps. In the past, people have tried to remove these surface contaminants with acid etches, but etching is often not appropriate. Another technique used in the past has been to deposit a glue-like material, called HMDS before depositing photoresist to overcome the problems caused by surface contaminants.

The present invention removes hydrocarbon and water surface contaminants by providing an apparatus and method for ablating these contaminants from the semiconductor surface. The high intensity short wave ultraviolet light generated by the present invention has been found to ablate and thus remove such surface contaminants, thereby preparing the semiconductor wafer for the next processing step. This process is substantially less expense and less risky than the prior art surface preparation techniques known to the inventor.

SUMMARY OF THE INVENTION

In summary, the present invention is an apparatus and method for removing organic polymers, such as photoresist and surface contaminants, from the surface of an object, such as a semiconductor wafer. The apparatus comprises a microwave energy source and a reaction chamber housing an ultraviolet lamp and a platform for holding a semiconductor wafer. A portion of the chamber's exterior, between the ultraviolet lamp and the microwave energy source, is permeable to microwaves. The reaction chamber has an inlet and an outlet for passing a reaction gas through the reaction chamber. The platform is situated so that the full surface of a semiconductor wafer thereon is exposed to light emitted by the ultraviolet lamp which responds to microwave stimulation from the microwave energy source by emitting ultraviolet radiation having a preselected wavelength between 100 and 300 angstroms. Photoresist and organic surface contaminants can be stripped from a semiconductor wafer on the platform by energizing the ultraviolet lamp while passing a reaction gas through the reaction chamber and thereby ablating organic polymers and impurities from the surface of the semiconductor wafer.

BRIEF DESCRIPTION OF THE DRAWINGS

Additional objects and features of the invention will be more readily apparent from the following detailed description and appended claims when taken in conjunction with the drawings, in which:

FIG. 1 is a block diagram of the invention.

FIG. 2 depicts a horizontal section of the preferred embodiment.

FIG. 3 is a partial vertical section of the preferred embodiment.

FIG. 4 is a partial plan view of the preferred embodiment.

DESCRIPTION OF THE PREFERRED EMBODIMENT

The invention removes photoresist and other organic polymers from the surface of an object by vaporizing and oxidizing the organic polymers.

Referring to FIG. 1, a photoresist stripper 20 in accordance with the present invention includes a microwave generator 22 which energizes an ultraviolet lamp 24 inside a reaction chamber 26. The ultraviolet light emitted by the lamp 24 irradiates the top surface of a semiconductor wafer 30 which is held in place by a vacuum chuck 32 inside the reaction chamber 24. The ultraviolet light ablates organic polymers, such as photoresist, on the exposed surface of the semiconductor wafer 30.

In the preferred embodiment, the ultraviolet lamp 24 contains a 2:1 mixture of Xenon and Helium, with a small quantity of Mercury. The mixture of gases in the lamp was selected to maximize the amount of ultraviolet light with a wavelength of 193 nanometers. The inventor has found that selection of this wavelength maximizes the rate of ablation of photoresist.

Depending on the organic polymer to be ablated, it will usually be preferred to select an ultraviolet wavelength between 100 and 300 nanometers. As is known to those skilled in the art, the wavelength of the ultraviolet light generated is a function of both the gas mixture used and the pressure of the gas inside the lamp.

In the preferred embodiment, approximately two grams of mercury are used in a lamp having a diameter of ¼ inch and a length of eighteen inches, and the gas mixture in the lamp is pressurized at four torr.

A reaction gas, oxygen in the preferred embodiment, flows through the reaction chamber. The reaction gas enters through an inlet 34 and exits through outlet 36. Unlike plasma etching processes which require that the process be carried out in a near vacuum, the process of the present invention can be performed at normal atmospheric pressure.

The inlet is located so that the reaction gas passes over the lamp 24. The ultraviolet light emitted by the lamp thermally and optically excites the oxygen reaction gas, thereby increasing the gas's tendency to combine with organic polymers ablated from the surface of the semiconductor by the ultraviolet light. The reaction gas combines with (i.e., oxidizes) the ablated photoresist and leaves the chamber by an outlet 36 in the bottom of the chamber.

The wall 28 of the chamber 26 which is between the microwave generator 22 and the ultraviolet lamp 26 is glass that partially reflects ultraviolet light from the lamp back into the chamber 24. The glass 28 is microwave permeable, thereby allowing the microwaves from the generator 22 to energize the lamp 26.

In the preferred embodiment, the glass 28 at the top of the chamber 28 is Pyrex, which partially reflects and partially absorbs ultraviolet light from the lamp 26.

The inner surface of the chamber's side walls are mirrored to reflect ultraviolet light back into the chamber so that the intensity of the ultraviolet light impinging on the semiconductor surface is maximized. In general, it is preferred that reflecting surfaces be used on all portions of the chamber's interior which face the semiconductor wafer's upper surface.

Underneath the lamp 26 there is a wire mesh 38 for reflecting the microwaves back past the lamp 26.

As is standard for ultraviolet lamps, the lamp 26 is made of high quality quartz glass because quartz is needed to transmit ultraviolet light.

Referring to FIG. 2 there is shown a horizontal section of the preferred embodiment. As shown, a microwave source 40 radiates microwaves into a microwave launching waveguide 42 using a standard launching section 44. The launching waveguide 42 has a height of one quarter wavelength, a width of one-half wavelength (see FIG. 4) and a length of n wavelengths, where n is an integer and the wavelength is the wavelength of the microwave in the waveguide.

From the launching waveguide 42, the generated microwaves travel through a quarter wave transformer 44 to a transformer 46 and mode mixer 48 which directs the microwaves into the reaction chamber 24. The upper portion of the reaction chamber, the bottom of which is defined by the wire mesh 38, acts as a microwave resonant cavity.

A pair of directional couplers 50 (both of which are shown in FIG. 4) are used to detect the intensity of the forward and reflected waves in the waveguide 42. By adjusting the position of a plunger 52 at the opposite side of the waveguide while monitoring the intensity of the forward and reflected waves, the amount of energy transferred from the microwave source to the lamp 26 can be maximized. In the preferred embodiment, the microwave source generates two kilowatts of incident power (i.e., power which is tranmitted into the chamber holding the semiconductor wafer) at a frequency of 2.45 gigahertz ±25 megahertz.

As shown in FIGS. 2 and 3, the lamp 26 in the preferred embodiment has a serpentine shape, which allows the use of a single long lamp to irradiate the wafer 30.

Other features of the preferred embodiment include a vacuum chuck 32 for holding semiconductor wafers 30 and a door 54 in the side of the chamber 24 through which wafers can be inserted and removed. The chuck 32 includes a mechanism for raising and lowering the chuck to facilitate automated insertion and removal of wafers from the chamber 24.

The use of microwaves to energize the ultraviolet lamp 26 is more energy efficient than using electrical stimulation because it takes less energy to stimulate the gas inside the lamp using microwaves. Also, lamp electrodes degenerate over time and thereby limit the lifetime of such ultraviolet lamps. Using a microwave energy source greatly extends the life of the lamp 26, and therefore decreases long term costs and maintenance requirements.

As indicated above, the above described apparatus can be used to remove surface contaminants such as water and hydrocarbons when preparing a semiconductor surface for a coating process, such as photoresist deposition. By subjecting the wafer to short wave ultraviolet light prior to any coating process, these surface contaminants will be removed and this will allow better adhesion of the deposited film to the semiconductor substrate.

In a second preferred embodiment, the gas mixture in the lamp 26 is Argon and Florine. The lamp is initially filled to a pressure of one torr with a Florine/Helium mixture containing approximately five percent Florine. Then Argon is added until the lamp's pressure rises to ten torr.

In summary, organic polymers such as photoresist and other surface contaminants are removed from the surface of an object by irradiating the object with shortwave (typically 100 to 300 nanometers) ultraviolet light in an oxidizing ambient. The ultraviolet light is generated by a microwave energized ultraviolet lamp.

The organic polymers are removed from the reaction chamber in which the process is performed by a reaction gas which can be used at substantially atmospheric pressure. The rate of ablative photochemical decomposition can be maximized by tuning the ultraviolet lamp to emit ultraviolet light with the wavelength best suited for ablating the organic polymers being removed.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. Photoresist and surface contaminant stripping apparatus, comprising
a microwave energy source; and
a reaction chamber housing an ultraviolet lamp and a platform for holding a semiconductor wafer, said chamber having an exterior portion between said ultraviolet lamp and said microwave energy source which is permeable to microwaves;
wherein
said reaction chamber has an inlet and an outlet for passing a reaction gas through said reaction chamber;
said platform is situated so that the full surface of a semiconductor wafer thereon is exposed to light emitted by said ultraviolet lamp; and
said ultraviolet lamp responds to microwave stimulation from said microwave energy source by emitting UV radiation having a preselected wavelength between 100 and 300 angstroms;
whereby photoresist can be stripped from a semiconductor wafer on said platform by energizing said ultraviolet lamp while passing a reaction gas through said reaction chamber and thereby ablating organic polymers and impurities from the surface of said semiconductor wafer.

2. The apparatus as set forth in claim 1, wherein said external portion of said reaction chamber is glass which at least partially internally reflects ultraviolet light.

3. The apparatus as set forth in claim 1, wherein the interior surfaces of said reaction chamber which face the upper surface of a semiconductor wafer on said platform substantially reflect ultraviolet light, thereby maximizing the intensity of the ultraviolet light impinging on the upper surface of said semiconductor wafer.

4. The apparatus as set forth in claim 1, wherein said inlet is situated so that said reaction gas flows past said lamp, so that said reaction gas is heated and excited before contacting said semiconductor wafer.

5. The apparatus as set forth in claim 1, wherein said reaction gas chemically combines with ablated photoresist.

6. A method of removing organic polymers from the surface of an object, the steps of the method comprising:
placing said object, having organic polymers on at least a portion of the object's surface, in a reaction chamber housing an ultraviolet lamp, said chamber having an exterior portion adjacent said ultraviolet lamp which is permeable to microwaves;
pumping said ultraviolet lamp with microwaves generated outside said reaction chamber; and
passing a reaction gas through said reaction chamber for carrying ablated organic polymers from said reaction chamber;
wherein
said object is placed so that at least a portion of the organic polymers on the surface of said object is exposed to light emitted by said ultraviolet lamp; and
said ultraviolet lamp emits ultraviolet radiation having a preselected wavelength between 100 and 300 angstroms;
whereby organic polymers can be stripped from a object's surface by energizing said ultraviolet lamp while passing a reaction gas through said reaction chamber and thereby ablating organic polymers and impurities from the surface of said object.

7. An organic polymer stripping method as set forth in claim 6, wherein said external portion of said reaction chamber is glass which at least partially internally reflects ultraviolet light.

8. An organic polymer stripping method as set forth in claim 6, wherein said reaction gas chemically combines with ablated photoresist.

9. A method of stripping photoresist from the surface of a semiconductor wafer, the steps of the method comprising:
placing a semiconductor wafer, having photoresist on at least a portion of the wafer's surface, in a reaction chamber housing an ultraviolet lamp, said chamber having an exterior portion adjacent said ultraviolet lamp which is permeable to microwaves;
pumping said ultraviolet lamp with microwaves generated outside said reaction chamber; and
passing a reaction gas through said reaction chamber for carrying ablated photoresist from said reaction chamber;
wherein
said semiconductor wafer is placed so that all of the photoresist on the surface of said wafer is exposed to light emitted by said ultraviolet lamp; and
said ultraviolet lamp emits UV radiation having a preselected wavelength between 100 and 300 angstroms;
whereby photoresist can be stripped from a semiconductor wafer by energizing said ultraviolet lamp while passing a reaction gas through said reaction chamber and thereby ablating organic polymers and impurities from the surface of said semiconductor wafer.

10. A photoresist stripping method as set forth in claim 9, wherein said external portion of said reaction chamber is glass which at least partially internally reflects ultraviolet light.

11. A photoresist stripping method as set forth in claim 10, wherein said reaction gas chemically combines with ablated photoresist.

12. A method of preparing a semiconductor wafer for a coating process, the steps of the method comprising:
placing said wafer, having surface contaminants on at least a portion of the wafer's upper surface, in a reaction chamber housing an ultraviolet lamp, said chamber having an exterior portion adjacent said ultraviolet lamp which is permeable to microwaves;
pumping said ultraviolet lamp with microwaves generated outside said reaction chamber; and
passing a reaction gas through said reaction chamber for carrying ablated surface contaminants from said reaction chamber;
wherein
said wafer is placed so that at least a portion of the upper surface of said wafer is exposed to light emitted by said ultraviolet lamp; and
said ultraviolet lamp emits ultraviolet radiation having a preselected wavelength between 100 and 300 angstroms;
whereby surface contaminants can be stripped from a wafer's surface by energizing said ultraviolet lamp while passing a reaction gas through said reaction chamber and thereby ablating surface contaminants from the surface of said wafer.

13. The method of claim 12, wherein said wafer is placed so that the entire upper surface of said wafer is exposed to light emitted by said ultraviolet lamp.

* * * * *